(12) United States Patent
Tokita et al.

(10) Patent No.: US 6,559,927 B1
(45) Date of Patent: *May 6, 2003

(54) GAP ADJUSTING METHOD IN EXPOSURE APPARATUS

(75) Inventors: Toshinobu Tokita, Utsunomiya (JP); Yutaka Tanaka, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,248

(22) Filed: Dec. 6, 1999

(30) Foreign Application Priority Data

Dec. 4, 1998 (JP) .......................................... 10-361914
Oct. 5, 1999 (JP) .......................................... 11-283694

(51) Int. Cl.[7] ........................ G03B 27/58; G03B 27/42; G03B 27/62
(52) U.S. Cl. .............................. 355/72; 355/53; 355/75
(58) Field of Search ........................ 355/53, 55, 72–74, 355/77; 378/34; 356/399–401

(56) References Cited

U.S. PATENT DOCUMENTS

| | | | | |
|---|---|---|---|---|
| 4,475,223 A | * | 10/1984 | Taniguchi et al. | 378/34 |
| 4,659,225 A | * | 4/1987 | Takahashi | 356/358 |
| 4,870,668 A | * | 9/1989 | Frankel et al. | 378/34 |
| 5,182,615 A | * | 1/1993 | Kurosawa et al. | 356/400 |
| 5,508,527 A | * | 4/1996 | Kuroda et al. | 250/491.1 |
| 5,883,932 A | | 3/1999 | Chiba et al. | 378/34 |
| 5,959,304 A | | 9/1999 | Tokita et al. | 250/492 |
| 6,144,719 A | * | 11/2000 | Hasegawa et al. | 378/34 |

FOREIGN PATENT DOCUMENTS

| | | |
|---|---|---|
| JP | 2-100311 | 4/1990 |
| JP | 1-14221 | 1/1992 |

* cited by examiner

*Primary Examiner*—Henry Hung Nguyen
(74) *Attorney, Agent, or Firm*—Fitzpatrick, Cella, Harper & Scinto (57) ABSTRACT

An exposure apparatus includes a gap measuring device for measuring a gap between a mask, having a mask membrane, and a substrate, a gap adjuster for adjusting the gap between the mask and the substrate and a driver for relatively moving the mask and the substrate relative to each other. The gap adjusting device adjusts the gap when the mask and the substrate are placed at a position at which they are opposed to each other in an area smaller than a predetermined area.

17 Claims, 6 Drawing Sheets

GAP ADJUSTING METHOD IN EXPOSURE APPARATUS

FIELD OF THE INVENTION AND RELATED ART

This invention relates generally to a semiconductor exposure apparatus for transferring, by exposure, a fine pattern of a semiconductor integrated circuit, formed on a mask, onto a substrate such as a wafer. More particularly, the invention is concerned with a semiconductor exposure apparatus of proximity type wherein exposure is performed while a mask and a wafer (substrate) are placed in close proximity to each other with a small spacing maintained therebetween. In another aspect, the invention is concerned with a device manufacturing method using such exposure apparatus.

In proximity type exposure apparatuses, exposure is performed while a mask and a substrate such as a wafer are placed in close proximity to each other with a small spacing maintained therebetween. An X-ray exposure apparatus is a representative example of them, and Japanese Laid-Open Patent Application, Laid-Open No. 100311/1990 shows an X-ray exposure apparatus using a synchrotron radiation (SR) light source, as an example.

Figure 5:
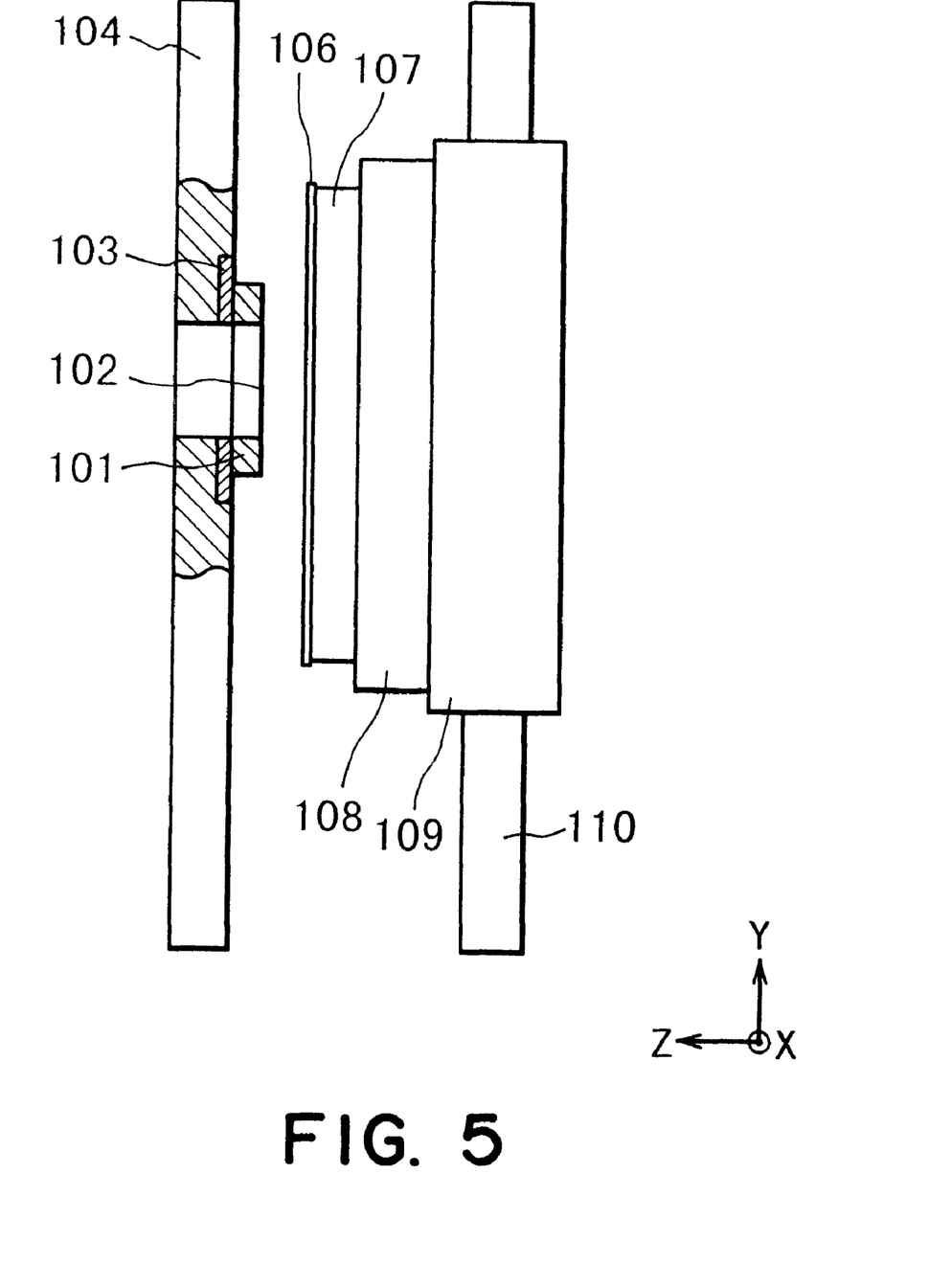
FIG. 5 is a partially fragmentary and schematic view of a general structure of a conventional proximity type exposure apparatus.

FIG. 5 is a schematic view of a general structure of an X-ray exposure apparatus. In FIG. 5, a mask 101 has a membrane 102 having a pattern formed thereon. The mask 101 is held by a mask chuck 103 which is mounted on a mask stage base 104, and it is positioned with respect to an X-ray light path. A wafer 106 (substrate) to be positioned opposed to and in close proximity to the mask 101, is held by a wafer chuck 107 which is mounted on a fine-motion stage 108 to be used for mask-to-wafer alignment. The wafer chuck 107 and the fine-motion stage 108 are mounted on a rough-motion stage 109 which is operable to move the wafer 106 stepwise so that exposure view angles on the wafer are sequentially placed in an X-ray irradiation region. A guide for the rough-motion stage 109 is fixed to a stage base 110.

Generally, in X-ray exposure apparatuses such as described above, the exposure operation is performed in accordance with a step-and-repeat method wherein the pattern on the membrane 102 is repeatedly printed on the wafer 106, and the mask membrane 102 and the wafer 106 are disposed opposed to each other with a small spacing of about 10–30 microns maintained therebetween (proximity exposure).

When, in such X-ray exposure apparatuses, the exposure is to be performed in accordance with a global alignment process, the procedure will be as follows:

(1) The rough-motion stage 109 moves the wafer 106 so that a first shot thereof in relation to the global alignment measurement, is placed below the mask membrane 102.

(2) The fine-motion stage 108 moves the wafer 106 to change the spacing (hereinafter, "gap") between the mask 101 and the wafer 106, from a gap for stepwise motion to a gap for gap measurement (hereinafter, "autofocus (AF) measurement"). Then, the AF measurement is performed by using gap measuring means, not shown.

(3) The parallelism between the mask 101 and the wafer 106 is corrected by using the fine-motion stage 108. Subsequently, any deviation between the mask 101 and the wafer 106 with respect to directions along the surfaces of them, is measured at plural points. Then, correction amounts for positional deviations of respective shots are calculated.

(4) The rough-motion stage 109 operates to move the wafer 106 so that a first exposure shot of the wafer 106 is placed below the mask membrane 102. Then, any positional deviation of the first exposure shot with respect to directions along the surface thereof, is corrected by means of the fine-motion stage 108. Thereafter, by using the fine-motion stage 108, the gap is adjusted to set the exposure gap there.

(5) An exposure is executed.

(6) The fine-motion stage 108 operates to retract the wafer to a position for the gap for stepwise motion. Then, the rough-motion stage 109 moves the wafer stepwise, so that a second exposure shot thereof is placed.

After this, the operations (4)–(6) are repeated, by which exposures of a predetermined number of shots on the wafer are accomplished.

Generally, a mask membrane is a very thin film of about 2 microns in thickness. Also, a mask and a wafer (substrate) are placed very close to each other with a small clearance held therebetween. If, therefore, the gap adjustment is performed to change the gap between the mask and the wafer, while the mask and the wafer are held opposed to each other in an area larger than a certain area, the mask membrane may deform so as to cancel the change in volume of the gap during the gap adjustment. Further, as the mask membrane and the wafer are opposed to each other, it takes a long time until the deformation of the mask membrane is attenuated. This causes deterioration of the exposure transfer precision or of the alignment measurement precision. Particularly, when the gap adjustment is made to enlarge the gap between the mask and the wafer, the membrane will deform toward the wafer side, such that there is a possibility that the membrane contacts the wafer.

The exposure operation or the alignment measurement cannot be started until deformation of the mask membrane is attenuated. This leads to a decrease of throughput.

SUMMARY OF THE INVENTION

It is an object of the present invention to provide a semiconductor exposure apparatus by which the exposure transfer precision as well as the alignment measurement precision can be improved significantly, and also by which a driving path of a stage for a substrate, such as a wafer, can be optimized for enlargement of the throughput.

It is another object of the present invention to provide a device manufacturing method by which efficient production of microdevices can be accomplished.

In accordance with an aspect of the present invention, there is provided an exposure apparatus, comprising: gap measuring means for measuring a gap between a mask, having a mask membrane, and a substrate; gap adjusting means for adjusting the gap; and driving means for relatively moving the mask and the substrate; wherein said gap adjusting means adjusts the gap when the mask and the substrate are placed at a position whereat they are opposed to each other in an area smaller than a predetermined area.

In one preferred form of this aspect of the present invention when the area in which the mask membrane and the substrate are opposed to each other is larger than a predetermined value, the gap adjustment is performed after moving the mask and/or the substrate to a position whereat the mask and the substrate are opposed to each other in an area smaller than the predetermined value.

The position for the gap adjustment may be determined in accordance with X-Y positional information on a substrate stage, for holding the substrate, before and after the gap adjustment.

Positional information on a substrate stage, for holding the substrate, may be produced in accordance with a shot layout of the substrate and a shot whereat the membrane and the substrate are opposed to each other.

An area in which the mask membrane and the substrate are opposed to each other may be calculated on the basis of positional information about a substrate stage for holding the substrate, and a state of opposition between the mask membrane and the substrate may be discriminated in accordance with a result of the calculation.

The state of opposition between the mask membrane and the substrate may be discriminated in accordance with a shot layout of the substrate and a shot whereat the membrane and the substrate are opposed to each other.

The order of shots may be determined in accordance with a current position of a substrate stage and a target position of the substrate stage.

The adjusting means may perform gap adjustment by moving the substrate in a tilt direction.

The driving means may move the substrate in a direction parallel to the surface of the substrate.

The driving means may move the substrate stepwise.

In accordance with another aspect of the present invention, there is provided a device manufacturing method, comprising the steps of: coating a substrate with a photosensitive material; exposing the substrate by use of an exposure apparatus as described above; and developing the exposed substrate.

In accordance with a further aspect of the present invention, there is provided a gap adjusting method for adjusting a gap between a mask and a substrate disposed opposed to each other, said method comprising the steps of: relatively moving the mask and the substrate relative to each other, to a predetermined position whereat a portion of a membrane of the mask is not opposed to the substrate; adjusting, at the predetermined position, the gap between the mask and the substrate, to a desired gap; and positioning, after the gas adjustment, the mask and the substrate into a desired positional relation with each other.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[First Embodiment]

Figure 1:
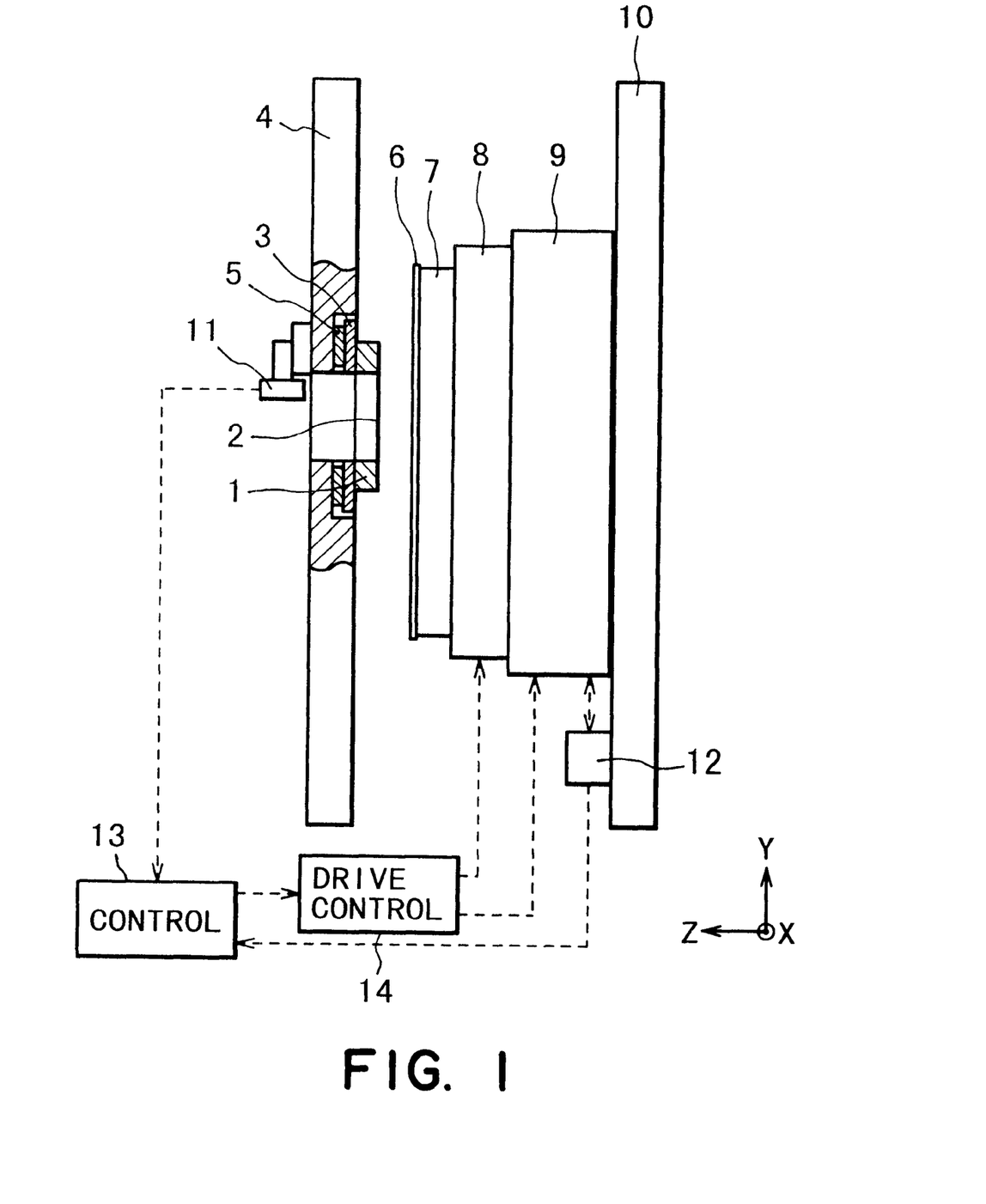
FIG. 1 is a partially fragmentary and schematic view of a general structure of a semiconductor exposure apparatus according to a first embodiment of the present invention.
Figure 2:
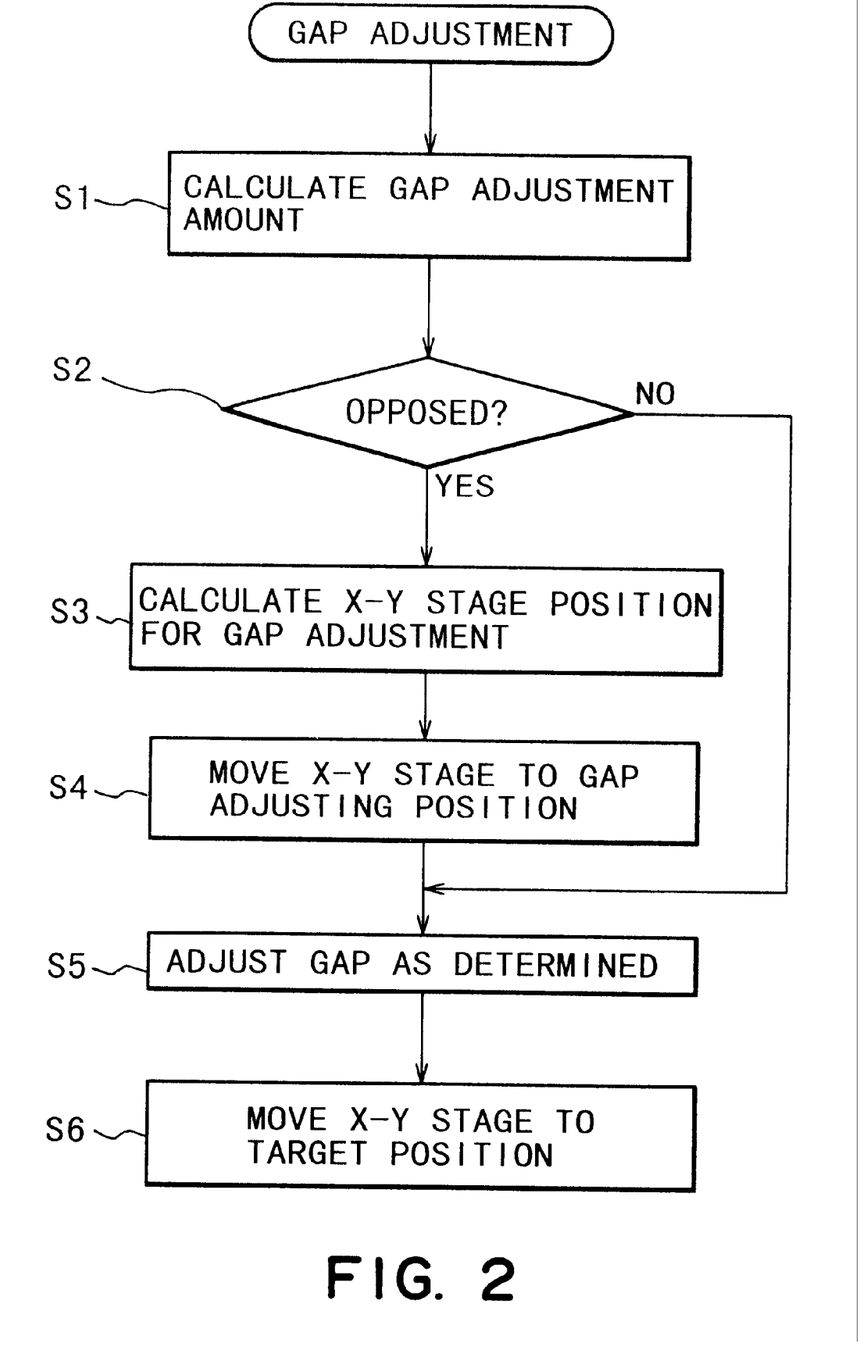
FIG. 2 is a flow chart for explaining the procedure of gap adjustment in the semiconductor exposure apparatus of the first embodiment.

FIG. 1 is a partially fragmentary and schematic view of a general structure of a semiconductor exposure apparatus according to a first embodiment of the present invention, and FIG. 2 is a flow chart for explaining the procedure of gap adjustment in the semiconductor exposure apparatus of the first embodiment.

In FIG. 1, a mask 1 has a mask membrane 2 having an absorptive material pattern formed thereon. The mask is held by a mask chuck 3. The mask 1 is placed, together with the mask chuck 3, upon a mask Z-tilt stage 5 which is mounted on a mask stage base 4. A wafer 6, which is a substrate to be disposed opposed to and in close proximity to the mask 1 with a small spacing held therebetween, is held by a wafer chuck 7. The wafer is placed, together with the wafer chuck 7, on a wafer Z-tilt stage 8 which is mounted on a wafer X-Y stage 9 to be used for stepwise motion between shots. A guide for the wafer X-Y stage 9 is fixedly connected to a stage base 10.

The mask stage base 4 is provided with a gap measuring means 11 for measuring the spacing or gap between the mask 1 and the wafer 6. The stage base 10 is provided with a measuring means 12 for measuring the position of the wafer X-Y stage 9, which comprises a laser interferometer, for example. Denoted at 13 is a control means which operates to determine driving amounts for the wafer Z-tilt stage 8 and the wafer X-Y stage 9, for example. Denoted at 14 is a drive control means for driving the wafer Z-tilt stage 8 or the wafer X-Y stage 9, in association with the control means 13.

The gap measuring method in the semiconductor exposure apparatus of this embodiment will be explained with reference to the flow chart of FIG. 2 and in accordance with the operation of the semiconductor exposure apparatus.

In the gap adjusting method of this embodiment, gap adjustment is performed (in accordance with the present invention) when at least the amount of adjustment for changing the gap is not less than a predetermined value. As regards the predetermined value for the adjustment amount in this case, since the relation between the gap adjustment amount and the amount of deformation of the mask membrane is approximately 1:3, the gap adjusting method of this embodiment may effectively be executed for the adjustment of a gap not smaller than a/3 where a is the tolerance for deformation of the mask membrane. The tolerance a of the membrane deformation may be about 1 micron, for example.

The adjustment of the gap between the mask and the wafer (substrate) in this embodiment is performed at a position whereat the mask membrane and the substrate are opposed to each other in an area smaller than a predetermined area, namely, at a position whereat at least a portion of the mask membrane is not opposed to the substrate (wafer). Such gap adjustment may be performed, for example, after wafer loading and prior to alignment measurement. Alternatively, it may be performed after completion of an exposure process and before wafer unloading. If the gap for alignment measurement differs from the gap for exposure, it may be done during a period after the alignment measurement and before the exposure process.

The procedure of gap adjustment to be done in a drive period between a shot A and a shot B, will now be explained, with reference to FIG. 2.

(1) First, a gap adjustment amount is calculated, on the basis of a current gap and a target gap (gap as desired)

(Step S1). The current gap may be measured by the gap measuring means 11, but it may be measured beforehand.

(2) Subsequently, discrimination is made as to whether the area in which the mask membrane 2 and the wafer 6 are opposed to each other is not less than a predetermined area (Step S2). The discrimination is executed by the control means 13, on the basis of the position of the wafer X-Y stage 9 determined as a result of measurement through the measuring means 12, which measures the position of the wafer X-Y stage 9. Alternatively, the position of the wafer X-Y stage 9 may be detected on the basis of the shot layout data of the wafer as well as the shot or shots whereat the mask membrane and the wafer are opposed to each other, and the above-described discrimination may be done on the basis of the detected positional information. Here, if the area in which the mask membrane 2 and the wafer 6 are opposed to each other is less than the predetermined value, the processes at Step S5 and steps following it are executed.

(3) If, at the stage (2) above, the area in which the mask membrane 2 and the wafer 6 are opposed to each other is larger than the predetermined value, the position for gap adjustment, that is, the position of the wafer X-Y stage 9 whereat the area in which the mask membrane 2 and the wafer 6 are opposed to each other becomes smaller than the predetermined area, is calculated by the control means 13 (Step S3). Further, the position of the wafer X-Y stage 9 for execution of the gap adjustment is so determined that the amount of movement of the wafer X-Y stage 9, from the shot A via the gap adjustment position to the shot B, becomes smallest.

(4) The wafer X-Y stage 9 is moved to the gap adjustment position as calculated at the stage (3) above (Step S4).

(5) By using the wafer Z-tilt stage 8, the gap is adjusted to a goal or desired gap (Step S5).

(6) The wafer X-Y stage 9 is moved to its target position (Step S6).

In an ordinary sequence, those shots to be used for alignment measurement as well as the shot layout concerning the order and number of shots to be exposed, for example, are determined beforehand. Therefore, the operations at (1)–(6) above may be determined as a driving path for the wafer X-Y stage 9.

Next, as a typical example of gap adjustment, description will be made, in conjunction with FIG. 3, with respect to transition from an alignment measurement process to an exposure process on an occasion when the alignment measurement gap differs from the exposure gap.

Here, it is assumed that the gap for alignment measurement is 30 microns, and the gap for exposure is 10 microns. Now, the gap adjustment method to be executed when the gap adjustment is to be made at a position whereat the area in which the mask membrane 2 and the wafer 6 are opposed to each other is smaller than a half of the whole area of the mask membrane 2, will be explained.

Figure 3:
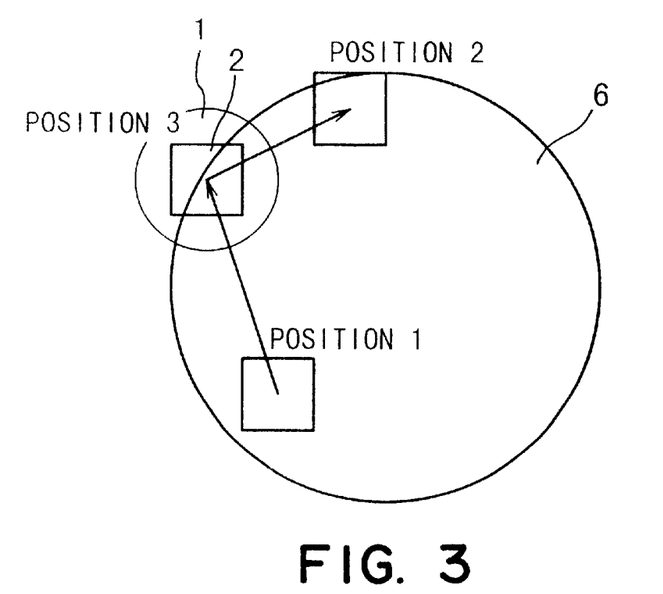
FIG. 3 is a schematic view for explaining a gap adjusting method in the semiconductor exposure apparatus of the first embodiment.

In FIG. 3, it is assumed that position 1 corresponds to a last alignment-measurement shot (current position of the wafer X-Y stage); position 2 corresponds to a first exposure shot (target position of the wafer X-Y stage); and position 3 corresponds to the position whereat the gap adjustment is to be done. It is to be noted that, although in FIG. 3 the mask 1 is illustrated as being moving, this is for better understanding of the positional relation between the mask 1 and the wafer 6. Actually, the wafer 6 is moved by the wafer X-Y stage 9. Further, the shot layout is not limited to the one illustrated.

First, from the gap at the position 1 (last alignment-measurement shot) and the gap at the position 2 (first exposure shot), the gap adjustment amount is calculated. Then, discrimination is made with respect to the state of opposition between the mask membrane 2 and the wafer 6 at the position 1. In the example shown in FIG. 3, at the position 1, the mask membrane 2 and the wafer 6 are opposed to each other, wholly. The discrimination above may be made by the control means 13, on the basis of the sizes of the mask membrane 2 and the wafer 6, and the position of the wafer X-Y stage 9. Also, the range in which the area, through which the mask membrane 2 and the wafer 6 are opposed to each other, becomes a half of the whole area of the mask membrane 2, may be calculated beforehand. Thus, on the basis of the shot layout, that is, on the basis of the position 1 and the position 3, the control means 13 calculates the position 3 so that the movement amount of the wafer X-Y stage 9 becomes smallest. As regards the movement from the position 1 to the position 2, first the wafer may be moved by the wafer X-Y stage 9 to the position 3, and at the position 3 the wafer X-tilt stage 8 may operate to adjust the gap from the alignment gap to the exposure gap. Thereafter, the wafer X-Y stage 9 may move the wafer from the position 3 to the position 2. If at the position 1 the area in which the mask membrane 2 and the wafer 6 are opposed to each other is smaller than a half of the membrane 2 area, at that position the wafer Z-tilt stage 8 may operate to adjust the gap to the exposure gap, such that the wafer may be moved directly to the position 2 from the position 1 by means of the wafer X-Y stage 9.

The example described above is a case where, in FIG. 3, the position 1 and the position 2 are separate from each other. On an occasion when the position 1 and the position 2 are at the same position and where only the gap should be adjusted at that position, a similar procedure may be done. More specifically, if the area in which the mask membrane 2 and the wafer 6 are opposed to each other is not less than a half of the mask membrane 2 area, the position 3 whereat the area in which the mask membrane 2 and the wafer 6 are opposed to each other becomes not larger than the mask membrane 2 area may be calculated, on the basis of the position 1. Subsequently, the wafer may be moved to the thus determined position 3, and, after completion of the gap adjustment performed at the position 3, it may be moved back to the position 1 (position 2). Although in this example the movement of the wafer X-Y stage 9 (that is, reciprocal movement to the position 3) takes a certain time, the time required for that movement would be significantly shorter than the time necessary for attenuation of deformation of the mask membrane (in a case where the gap adjustment is made while the wafer and the mask membrane are held opposed to each other, without reciprocal movement, it takes a long time until deformation of the membrane is attenuated). If the area in which the mask membrane 2 and the wafer 6 are opposed to each other is smaller than a half area of the mask membrane 2, the movement to the position 3 is unnecessary, as a matter of course.

Although in the above-described example the gap adjustment position (position 3) is calculated on the basis of the position 1 and the position 2 so as to minimize the movement amount of the wafer X-Y stage, the present invention is not limited to this. An alternative example may be that: the X-Y position coordinate system of the wafer may be divided along X and Y axes, passing through the center of the mask membrane, into four quarters of the first to fourth quadrants. In each divided zone, the gap adjustment position (position $3_1$, position $3_2$, position $3_3$ and position $3_4$) may be set beforehand, the positions being unshown. Then, on the basis of the position 1 and the position 2, discrimination may be made as to which, of the positions $3_1$–$3_4$ in the quadrants, is appropriate. Further, the division into four quarters is merely an example, and the number of divisions is not limited to four.

In accordance with this embodiment as described hereinbefore, when the gap adjustment amount for changing the gap between a mask and a substrate (wafer) is not less than a predetermined value, the gap adjustment is performed at the position whereat the mask membrane and the substrate are opposed to each other in an area smaller than a predetermined area (that is, at a position whereat at least a portion of the mask membrane is not opposed to the substrate, such as a wafer). If the the area in which the mask membrane and the substrate are opposed to each other is not less than the predetermined value, the gap adjustment is made after moving it to a position whereat the aforementioned area becomes smaller than the predetermined area. With this procedure, gap adjustment can be accomplished without causing deformation or breakage of the mask membrane.

Further, the position for the gap adjustment is determined on the basis of the X-Y positional information of the substrate stage, before and after the gap adjustment. This enables determining the gap adjustment position in an optimum drive path, on the basis of the X-Y position of the substrate stage and the target X-Y position thereof.

Moreover, the state of opposition between the mask membrane and the substrate can be discriminated on the basis of calculation of the area of which the mask membrane and the substrate are opposed to each other, the calculation being made on the basis of measurement of the X-Y position of the substrate stage. Alternatively, the X-Y position of the substrate stage may be detected from the shot layout of the substrate and the shot where the mask membrane and the substrate are opposed to each other, and then, the state of opposition may be discriminated from the high-precision X-Y positional information of the substrate stage. In accordance with the state of opposition thus discriminated, movement to the gap adjustment position may be executed. Also, movement to the gap adjustment position may be made along an optimum drive path. Thus, during the gap adjustment, the movement amount not for the gap adjustment itself can be optimized. As a result, the throughput can be enlarged remarkably.

In accordance with this embodiment, as described hereinbefore, the gap adjustment can be accomplished without deformation or breakage of the mask membrane. This effectively improves the exposure transfer precision or alignment measurement precision. Further, for a particular shot layout determined. the drive path of the wafer X-Y stage can be changed, such that the movement amount not directly related to the gap adjustment can be optimized. The throughput can be improved significantly.

In the present embodiment, the position for gap adjustment is determined at such a position whereat the area in which the mask membrane 2 and the wafer 6 are opposed to each other is not larger than a half of the mask membrane 2 area. However, the invention is not limited to this. For example, a position whereat the peripheral edge of the wafer 6 passes the center of the mask membrane 2 may be selected at the gap adjustment position. On that occasion, however, at least a portion of the mask membrane 2 should include a zone which is not opposed to the wafer.

While in this embodiment the gap adjustment is performed by using the wafer Z-tilt stage, it may be done by moving one of the mask and the wafer so that they are relatively moved close to each other or away from each other.

[Second Embodiment]

In the first embodiment described above, the X-Y driving path including the gap adjustment position is determined in accordance with the order or sequence of shots determined beforehand. As compared therewith, in the second embodiment, the order of shots is determined in the course of gap adjustment. The structure of the semiconductor exposure apparatus is similar to that of the first embodiment.

Figure 4:
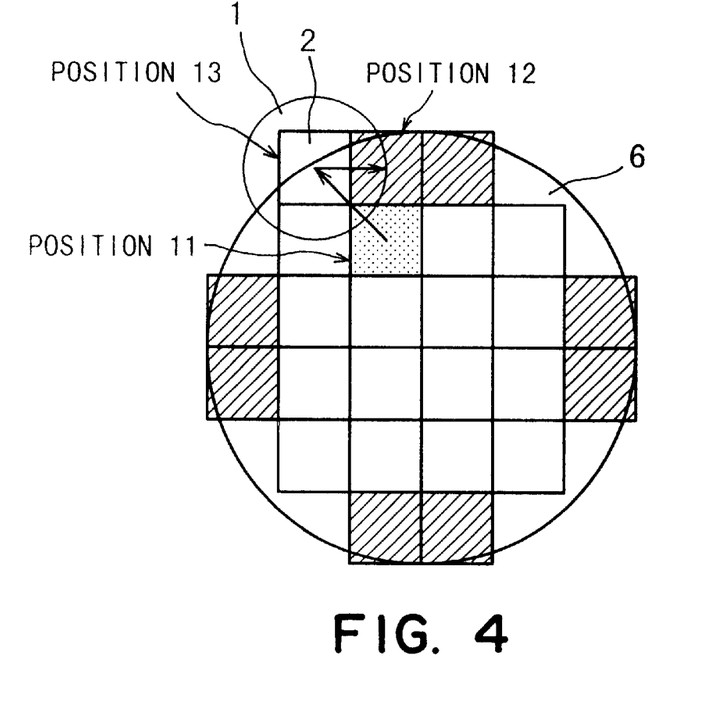
FIG. 4 is a schematic view for explaining a gap adjusting method in a semiconductor exposure apparatus according to a second embodiment of the present invention.

The second embodiment will be explained, like that for the first embodiment, with reference to a case of transition from the alignment measurement process to the exposure process. FIG. 4 is an illustration for explaining the manner of determining the order of shots. In FIG. 4, position 11 corresponds to the position of a last alignment-measurement shot, and position 12 corresponds to the position of a first exposure shot. Position 13 corresponds to the position whereat the gap adjustment is to be executed.

(1) The wafer X-Y stage 9 is at a last alignment-measurement shot position (position 11).

(2) The shortest-distance position (position 13) of the water X-Y stage 9 whereat the area in which the mask membrane 2 and the wafer 6 are opposed to each other becomes not larger than a half of the mask membrane 2 area, is calculated. Then, the wafer X-Y stage 9 moves the wafer to the position 13.

(3) By using the wafer Z-tilt stage 8, the gap between the mask membrane 2 and the wafer 6 is adjusted to the exposure gap.

(4) In accordance with the shot layout, the wafer X-Y stage 9 moves to a position (position 12) which is closest from the position (position 13) whereat adjustment to the exposure gap has been made. This shot is taken as a first exposure shot.

(5) On the basis of the thus determined first exposure shot and of the shot layout, the order of shots which can provide a shortest drive path is determined.

An alternative method will be as follows.

First, zones with hatching in FIG. 4 may be selected as options for the first exposure shot. If any shot other than the zones with hatching is selected as the first exposure shot, the times of operations for shifting the wafer X-Y stage 9 obliquely increase, and the throughput decreases. As compared therewith, when any of the hatched zones is selected as the first exposure shot, the times for moving the wafer X-Y stage obliquely is minimized. If, for example, in FIG. 4, the position 12 is selected as the first exposure shot, the second shot may be on the right of the first shot, the third shot may be on the lower right of the second shot, the fourth shot may be on the left of the third shot, . . . and so on. Thus, the times for shifting the wafer X-Y stage 9 obliquely can be minimized.

In summary:

(1) An option for the first exposure shot, which is closest from the last alignment-measurement shot (position 11) is selected, and the position thereof is taken as the first exposure shot (position 12).

(2) On the basis of the position 11 and the position 12, the shortest-distance position (position 13) of the wafer X-Y stage 9 whereat the area in which the mask membrane 2 and the wafer 6 are opposed to each other becomes not larger than the area of the mask membrane 2, is calculated. Then, the wafer X-Y stage 9 moves the wafer to the position 13. For this motion, the wafer X-Y stage 9 may be moved while executing correction drive through the wafer Z-tilt stage 8, to thereby suppress the gap change within a predetermined range.

(3) By using the wafer Z-tilt stage 8, the gap is adjusted to the exposure gap.

(4) By using the wafer X-Y stage 9, the wafer is moved to the position 12 (first exposure shot). As regards the moving method, like (2) above, the wafer X-Y stage 9 is moved while executing correction drive through the wafer Z-tilt stage 8, to suppress the gap change to a predetermined value or less.

It is to be noted that, although in FIG. 4, the mask 1 is illustrated as being moving, this is for a better understanding of the positional relation between the mask and the wafer. Actually, the wafer 6 is moved by the wafer X-Y stage 9. Further, the shot layout is not limited to the one illustrated.

In accordance with this embodiment as described hereinbefore, the order of shots for alignment measurement or exposure can be changed so as to optimize the drive path of the wafer X-Y stage in accordance with the position of the wafer X-Y stage before the gap adjustment As a result, the throughput can be enlarged remarkably.

Further, in this embodiment, like the preceding embodiment, the position for gap adjustment is determined at such a position whereat the area in which the mask membrane 2 and the wafer 6 are opposed to each other is not larger than a half of the mask membrane 2 area. However, the invention is not limited to this. For example, a position whereat the peripheral edge of the wafer 6 passes the center of the mask membrane 2 may be selected at the gap adjustment position. On that occasion, however, at least a portion of the mask membrane 2 should include a zone which is not opposed to the wafer.

[Third Embodiment]

Next, an embodiment of a semiconductor device manufacturing method which uses a semiconductor exposure apparatus such as described above, will be explained.

Figure 6:
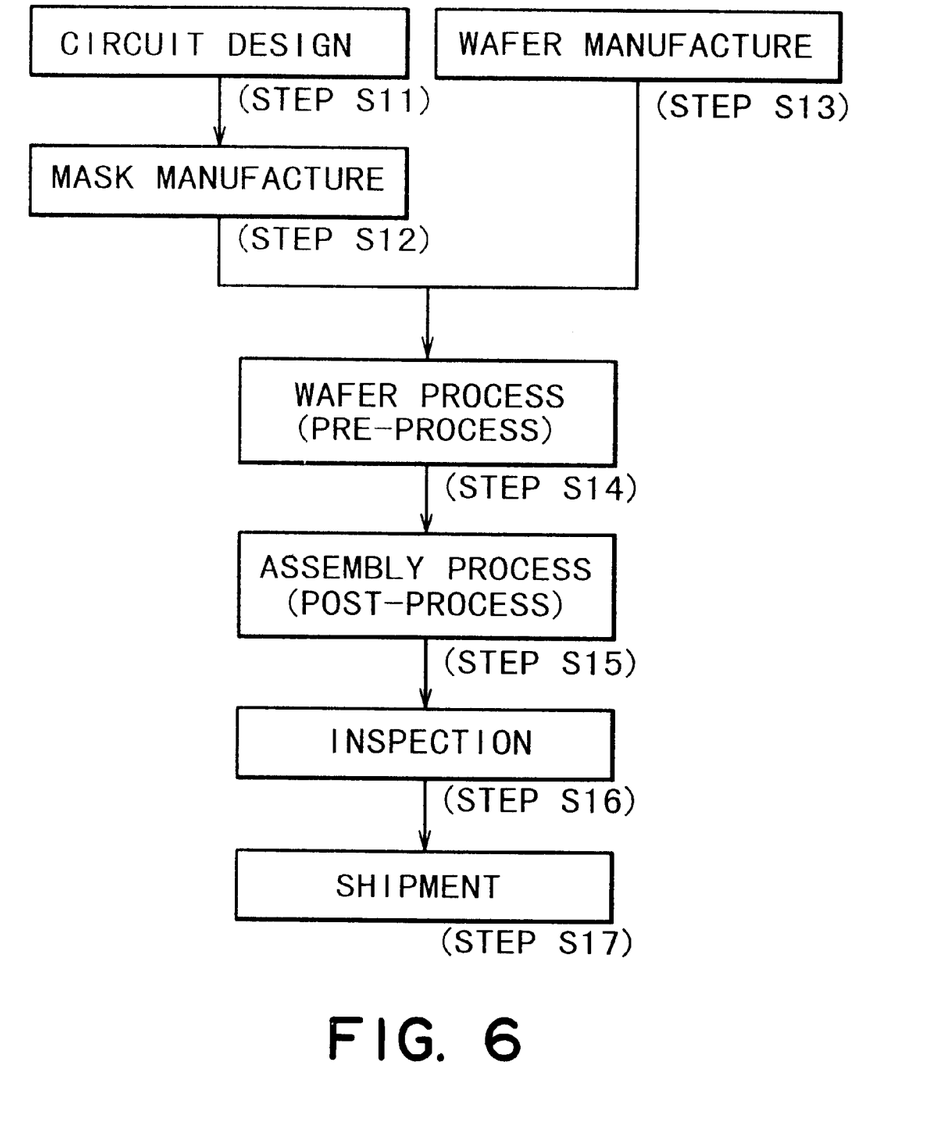
FIG. 6 is a flow chart of semiconductor device manufacturing processes.

FIG. 6 is a flowchart of a procedure for the manufacture of microdevices such as semiconductor chips (e.g., ICs or LSIs), liquid crystal panels, CCDs, thin film magnetic heads or micro-machines, for example.

Step S11 is a design process for designing a circuit of a semiconductor device. Step S12 is a process for making a mask on the basis of the circuit pattern design. Step S13 is a process for preparing a wafer by using a material such as silicon. Step S14 is a wafer process (called a pre-process) wherein, by using the so prepared mask and wafer, circuits are practically formed on the wafer through lithography. Step S15 subsequent to this is an assembling step (called a post-process) wherein the wafer having been processed by step S14 is formed into semiconductor chips. This step includes an assembling (dicing and bonding) process and a packaging (chip sealing) process. Step S16 is an inspection step wherein an operation check, a durability check and so on for the semiconductor devices provided by step S15, are carried out. With these processes, semiconductor devices are completed and they are shipped (step S17).

Figure 7:
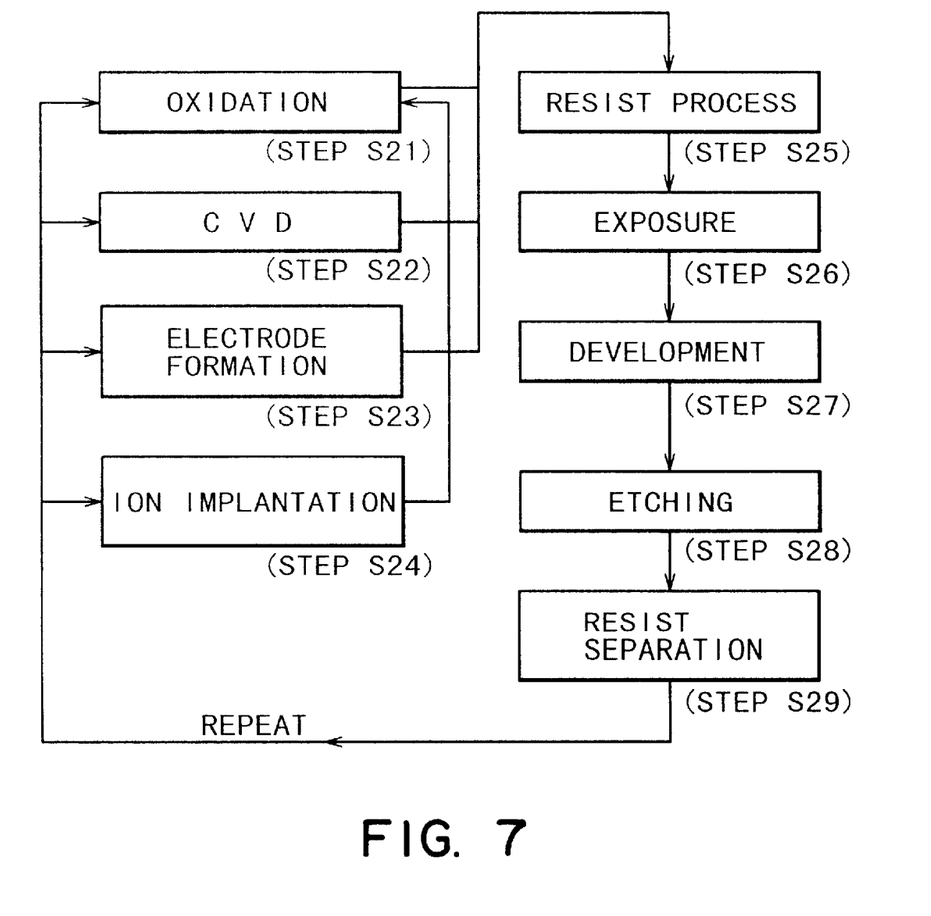
FIG. 7 is a flow chart for explaining details of a wafer process in the procedure of FIG. 6.

FIG. 7 is a flow chart showing details of the wafer process.

Step S21 is an oxidation process for oxidizing the surface of a wafer. Step S22 is a CVD process for forming an insulating film on the wafer surface. Step S23 is an electrode forming process for forming electrodes upon the wafer by vapor deposition. Step S24 is an ion implanting process for implanting ions to the wafer. Step S25 is a resist process for applying a resist (photosensitive material) to the wafer. Step S26 is an exposure process for printing, by exposure, the circuit pattern of the mask on the wafer through the exposure apparatus described above. Step S27 is a developing process for developing the exposed wafer. Step S28 is an etching process for removing portions other than the developed resist image. Step S29 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein. it is not confined to the details set forth and this application is intended to cover such modifications or changes as may come within the purposes of the improvements or the scope of the following claims.

What is claimed is:

1. An exposure apparatus, comprising:

gap measuring means for measuring a gap between a mask, having a mask membrane, and a substrate;

gap changing means for changing the gap between the mask and the substrate; and driving means for relatively moving the mask and the substrate relative to each other, wherein said gap changing means changes the gap on condition that a correction amount for changing the gap is not less than a predetermined amount and also that the mask and the substrate are placed at a position at which they are opposed to each other in an area smaller than a predetermined area.

2. An apparatus according to claim 1, wherein, when the area in which the mask membrane and the substrate are opposed to each other is larger than a predetermined value, said gap changing means changes the gap after moving at least one of the mask and the substrate to a position at which an area of the mask membrane, which is opposed to the substrate, is not less than a predetermined area.

3. An apparatus according to claim 1, wherein the position for the gap changing is determined in accordance with X-Y positional information regarding a substrate stage, for holding the substrate, before and after the gap is changed.

4. An apparatus according to claim 1, wherein positional information regarding a substrate stage, for holding the substrate, is produced in accordance with a shot layout of the substrate and a shot at which the membrane and the substrate are opposed to each other.

5. An apparatus according to claim 1, wherein an area in which the mask membrane and the substrate are opposed to each other is calculated on the basis of positional information regarding a substrate stage for holding the substrate, and wherein a state of opposition between the mask membrane and the substrate is discriminated in accordance with a result of the calculation.

6. An apparatus according to claim 1, wherein a state of opposition between the mask membrane and the substrate is discriminated in accordance with a shot layout of the substrate and a shot at which the membrane and the substrate are opposed to each other.

7. An apparatus according to claim 1, wherein the order of shots is determined in accordance with a current position of a substrate stage and a target position of the substrate stage.

8. An apparatus according to claim 1, wherein said changing means performs the gap change by moving the substrate in a tilt direction.

9. An apparatus according to claim 1, wherein said driving means moves the substrate in a direction parallel to the surface of the substrate.

10. An apparatus according to claim 1, wherein said driving means moves the substrate stepwise.

11. A device manufacturing method, comprising the step of:

coating a substrate with a photosensitive material;

exposing the substrate by use of an exposure apparatus as recited in claim 1; and developing the exposed substrate.

12. A gap changing method for changing a gap between a mask and a substrate disposed opposed to each other, said method comprising the steps of:

relatively moving the mask and the substrate relative to each other, to a predetermined position at which a portion of a membrane of the mask is offset from the substrate;

changing, at the predetermined position, the gap between the mask and the substrate, to a desired gap; and positioning, after the gap is changed, the mask and the substrate into a desired positional relation with each other.

13. An exposure apparatus, comprising:

gap measuring means for measuring a gap between a mask, having a membrane, and a substrate;

gap changing means for changing the gap between the mask and the substrate; and driving means for relatively moving the mask and the substrate relative to each other, wherein said gap changing means changes the gap on condition that a correction amount for changing the gap is not less than the predetermined amount and also that the mask and the substrate are placed at a position at which at least a portion of the mask membrane is offset from the substrate.

14. An apparatus according to claim 1, wherein the correction amount for changing the gap is not less than the predetermined amount (i) when, after the substrate is supplied, the gap between the mask and the substrate is to be set to one of an alignment gap or an exposure gap, (ii) when an alignment gap is to be changed to an exposure gap, and (iii) when the substrate after exposure is to be collected.

15. An exposure apparatus, comprising:

gap measuring means for measuring a gap between a mask, having a mask membrane, and a substrate;

gap changing means for changing the gap between the mask and the substrate; and driving means for relatively moving opposed surfaces of the mask and the substrate in substantially mutually parallel directions, wherein the mask and the substrate can be opposed to each other in an area determined by an outer configuration of the mask and the substrate, and wherein, when the area in which the mask and the substrate are opposed to each other is not less than a predetermined area, said driving means relatively moves the mask and the substrate in substantially parallel directions so that the area becomes equal to or less than the predetermined area, and subsequently, said gap changing means changes the gap between the mask and the substrate.

16. An apparatus according to claim 15, wherein, when a correction amount for changing the gap is not less than a predetermined amount, said driving means relatively moves the mask and the substrate in substantially parallel directions so that the area in which the mask and the substrate are exposed to each other become equal to or less than the predetermined area, and subsequently said gap changing means changes the gap.

17. An apparatus according to claim 15, wherein the correction amount for changing the gap is not less than the predetermined amount (i) when, after the substrate is supplied, the gap between the mask and the substrate is to be set to one of an alignment gap or an exposure gap, (ii) when the alignment gap is to be changed to an exposure gap, and (iii) when the substrate after exposure is to be collected.

* * * * *

UNITED STATES PATENT AND TRADEMARK OFFICE
CERTIFICATE OF CORRECTION

PATENT NO.     : 6,559,927 B1                                        Page 1 of 1
DATED          : May 6, 2003
INVENTOR(S)    : Toshinobu Tokita et al.

It is certified that error appears in the above-identified patent and that said Letters Patent is hereby corrected as shown below:

Column 1,
Line 60, "means," should read -- means --.
Line 61, "not shown." should read -- (not shown). --.

Column 6,
Line 21, "X-tilt" should read -- Z-tilt --.

Column 7,
Line 14, "the the" should read -- the --.

Column 12,
Line 26, "become" should read -- becomes --.

Signed and Sealed this

Seventh Day of October, 2003

JAMES E. ROGAN
*Director of the United States Patent and Trademark Office*